(12) United States Patent
Bajaj et al.

(10) Patent No.: US 6,204,169 B1
(45) Date of Patent: Mar. 20, 2001

(54) PROCESSING FOR POLISHING DISSIMILAR CONDUCTIVE LAYERS IN A SEMICONDUCTOR DEVICE

(75) Inventors: Rajeev Bajaj; Janos Farkas, both of Austin; Sung C. Kim, Pflugerville; Jaime Saravia, Round Rock, all of TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 08/822,025

(22) Filed: Mar. 24, 1997

(51) Int. Cl.$^7$ ............................................... H01L 21/4763
(52) U.S. Cl. ........................ 438/645; 438/628; 438/629; 438/644; 438/652; 438/654; 438/626; 438/633; 438/689; 438/690; 438/691; 438/692; 438/693; 451/57; 451/59; 451/37; 451/41
(58) Field of Search .................................... 438/628, 629, 438/644, 652, 654, 626, 633, 645, 689–693; 451/57, 59, 37, 41

(56) References Cited

U.S. PATENT DOCUMENTS

| | | | |
|---|---|---|---|
| 4,448,634 | 5/1984 | Lampert ................. | 156/636 |
| 5,209,816 | 5/1993 | Yu et al. ................. | 156/636 |
| 5,340,370 * | 8/1994 | Cadien et al. ............. | 51/308 |
| 5,352,277 | 10/1994 | Sasaki ..................... | 106/6 |
| 5,516,346 | 5/1996 | Cadien et al. ............. | 51/308 |
| 5,676,587 * | 10/1997 | Landers et al. ............ | 451/57 |
| 5,700,383 | 12/1997 | Feller et al. .............. | 216/88 |
| 5,756,398 * | 5/1998 | Wang et al. ............... | 438/692 |
| 5,858,813 * | 1/1999 | Scherber et al. ........... | 438/693 |

FOREIGN PATENT DOCUMENTS

| | | | | |
|---|---|---|---|---|
| 9800501-0 * | 3/1998 | (AT) | ............................ | H01L/21/231 |
| 1133218 | 5/1989 | (JP) | ............................ | G11B/5/84 |
| 2285518 | 11/1990 | (JP) | ............................ | G11B/5/84 |

OTHER PUBLICATIONS

Brown et al., "Electrochemical and in situ atomic force microscopy and scanning tunneling microscopy investigations of titanium in oxalic acid solution"; J. Vac. Technl. vol. 10 No. 5 Sep./Oct. 1992, pp. 3001–3006.

* cited by examiner

*Primary Examiner*—John F. Niebling
*Assistant Examiner*—David A. Zarneke

(57) ABSTRACT

A process of polishing two dissimilar conductive materials deposited on semiconductor device substrate optimizes the polishing of each of the conductive material independently, while utilizing the same polishing equipment for manufacturing efficiency. A tungsten layer (258) and a titanium layer (256) of a semiconductor device substrate (250) are polished using one polisher (10) but two different slurry formulations. The two slurries can be dispensed sequentially onto the same polishing platen (132) from two different urce containers (111 and 112), wherein the first slurry is dispensed until e tungsten is removed and then the slurry dispense is switched to second slurry for removal of the titanium. In a preferred embodiment, the first slurry composition is a ferric nitrate slurry while the second slurry composition is an oxalic acid slurry.

22 Claims, 2 Drawing Sheets

PROCESSING FOR POLISHING DISSIMILAR CONDUCTIVE LAYERS IN A SEMICONDUCTOR DEVICE

CROSS-REFERENCE TO RELATEED APPLICATION

The present invention relates to the following commonly assigned, copending applications:

1) "Process for Polishing A Semiconductor Device Substrate," by Kim et al., Ser. No. 08/780,113, filed Dec. 26,1996; and 2) "Process for Forming A Semiconductor Device," by Nagabushnam et al., Ser. No. 08/783,975, filed Jan. 15, 1997; and 3) "Slurry for Chemically-Mechanically Polishing a Layer and Method of Use," by Farkas et al., Ser. No. 08/684,782, filed Jul. 22, 1996.

FIELD OF THE INVENTION

The present invention relates generally to processes for polishing, and more particularly, to processes for polishing semiconductor device substrates.

BACKGROUND OF THE INVENTION

Chemical mechanical polishing (CMP) is presently used to polish a variety of materials found in semiconductor devices. Those materials include metals, such as tungsten, aluminum, and copper. Regardless of the type of material being polished, similar techniques are used. For example, a polishing system typically includes a polishing platen, on which is attached a polishing pad. While the platen is being rotated, a slurry is dispensed while a semiconductor wafer is pressed against the pad. A combination of the chemical reaction between the slurry and the layer being polished and the mechanical interaction between abrasives within the slurry and the layer being polished cause the planarization of the layer.

In some instances, two layers of different materials are deposited on each other in a semiconductor substrate, and both materials need to be polished, preferably in a continuous polishing operation to minimize cycle time. Commercially available polishing slurries do not provide ideal properties for polishing two dissimilar materials during the same polishing operation. For example, when polishing tungsten that is deposited on a titanium/titanium nitride layer, the polishing properties of tungsten and the titanium layer differ greatly. Titanium is a relatively difficult material to polish using a slurry composition optimized for tungsten polishing. Slurry formulations that successfully polish titanium typically do not polish tungsten as fast as other slurries. In most cases, optimizing the polishing conditions for one material, for example tungsten, leads to a degradation of the polishing characteristics of the other materials, such as titanium.

One known method for polishing a combination of tungsten and titanium is to use a relatively hard or abrasive polishing pad, such as a Suba 500 made by Rodel, Inc. of Delaware, with a slurry formulated for tungsten polishing (e.g. a ferric nitrate slurry). The polishing slurry does not significantly chemically react with the titanium, therefore use of a harder polishing pad is effective in mechanically removing titanium. However, problems with this method include 1) a lower tungsten polishing rate than if a softer pad is used; and 2) high oxide removal or erosion during polishing. Oxide removal or erosion is undesirable because it is generally non-uniform across the wafer, being faster in dense feature arrays and slower in peripheral areas. Use of a softer pad, such as a Politex pad, also by Rodel, Inc. of Wilmington Delaware, results in less removal of oxide, but inadequately removes titanium.

Another method for overcoming the problem of polishing tungsten and titanium is to polish the tungsten away, but leave the titanium layer in place. An interconnect metal layer(s), such as aluminum, is then deposited on the remaining titanium layer, and the aluminum and titanium layers are simultaneously patterned and etched. By etching the titanium layer with the aluminum, the need to polish away the titanium is eliminated. However, the titanium layer is nonetheless exposed to the polishing process during the polishing of tungsten. Consequently, the quality of titanium under the aluminum is poor and reliability of the resulting aluminum interconnects is degraded.

Accordingly, there is a need in the industry to establish a polishing process that can effectively polish two dissimilar conductive materials in a cost effective manner that is conducive to a manufacturing environment.

DETAILED DESCRIPTION OF A PREFERRED EMBODIMENT

Generally, the present invention provides a method of polishing two dissimilar conductive materials deposited on semiconductor device substrate. While prior art techniques for polishing sequentially deposited dissimilar materials use a common slurry and set of polishing parameters, the present invention optimizes the polishing of each of the conductive material independently, while utilizing the same polishing equipment for manufacturing efficiency. In one embodiment, a tungsten layer is deposited on a titanium layer, and the two layers are polished using one polisher but two different slurry formulations. A first slurry composition is optimized for polishing tungsten, and a second slurry composition is optimized for polishing titanium. The two slurries can be dispensed sequentially onto the same polishing platen and pad from two different sources, wherein the first slurry is dispensed until the tungsten is removed and then the slurry dispense is switched to the second slurry for removal of the titanium. In a preferred embodiment, the first slurry composition is a ferric nitrate based slurry while the second slurry composition is an oxalic acid based slurry. In this embodiment, both slurries have a similar pH (both ferric nitrate and oxalic acid being acidic). Use of an oxalic acid slurry as the second slurry composition not only polishes titanium more effectively than traditional tungsten slurry formulations, but also ties up iron atoms to prevent unwanted incorporation of iron into dielectric layers of the semiconductor device substrate. Preferably, polishing of the two conductive layers is accomplished using the same polishing pad, and while the semi-conductor substrate is continuously in contact with the rotating pad, but wherein the two different polishing slurries are sequentially deposited onto the same pad to polish the two different conductive materials. By merely dispensing the two different slurries onto the same polishing platen and pad, manufacturing time is not adversely affected since transporting of the wafers between polishings is unnecessary.

These and other features, and advantages, will be more clearly understood from the following detailed description taken in conjunction with FIGS. 1–5. It is important to point out that the illustrations are not necessarily be drawn to scale, and that there are likely to be other embodiments of the present invention which are not specifically illustrated.

Figure 1:
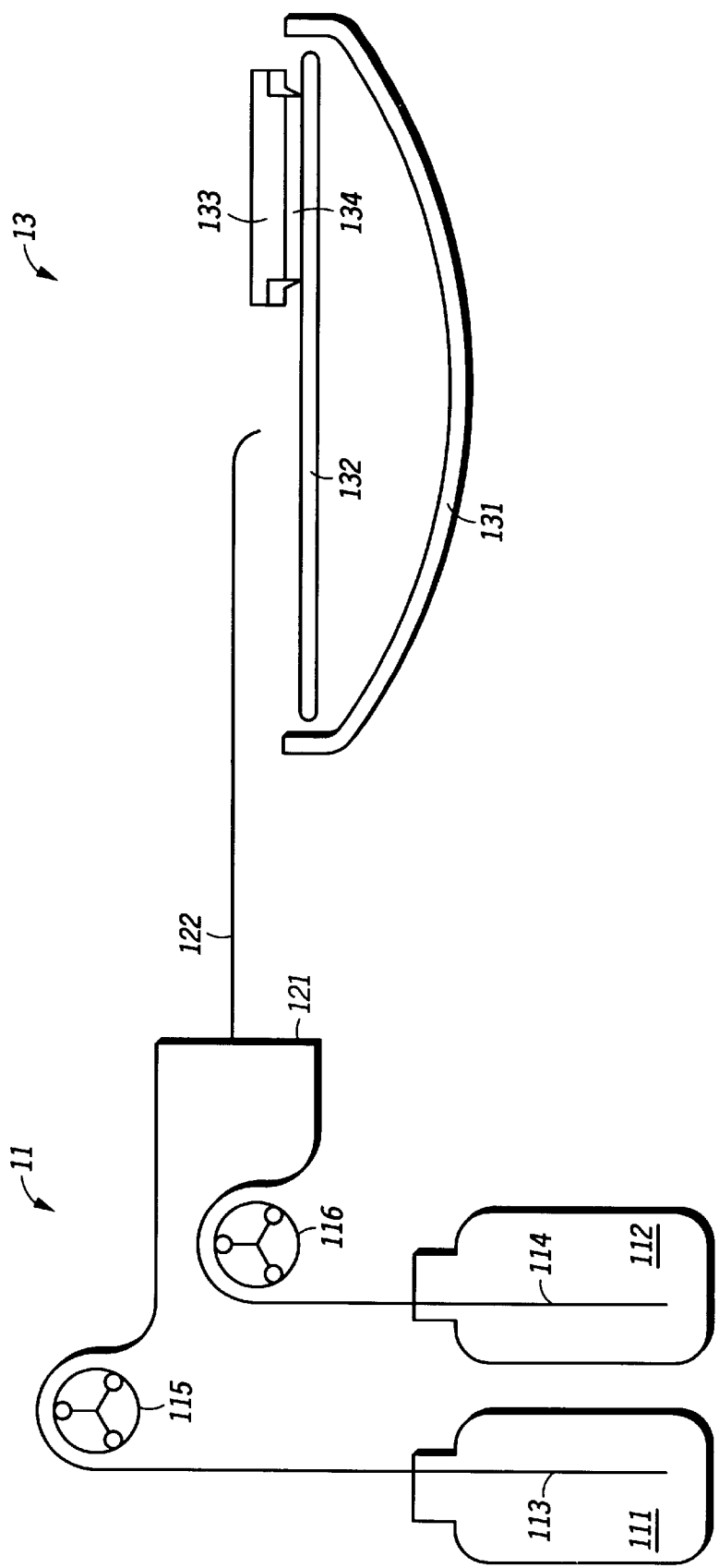
FIG. 1 is a schematic view of a chemical mechanical polisher for polishing a se conductor device in accordance with the present invention.

FIG. 1 includes a schematic view of a portion of a chemical-mechanical polisher 10 for use in practicing the present invention. The chemicalmechanical polisher 10 has two sections that include a feed section 11 and a polishing section 13. Within the feed section are two containers 111 and 112. The two containers 111 and 112 include two different polishing fluids for polishing two different conductive layers of a semiconductor device substrate in accordance with the present invention. For example, container 111 includes a tungsten polishing slurry, such as ferric nitrate, and container 112 includes a polishing slurry chosen to polish titanium, such as an oxalic acid slurry. While in the embodiment illustrated in FIG. 1, the two different polishing slurries are shown as being premixed (i.e. the three primary components of the slurry—oxidizing agent, abrasive particles, and water—are mixed together within the container), it is important to understand that the oxidizing components and the diluted abrasive components of the polishing slurries can be stored and delivered separately and then mixed near the point of dispensing onto the polishing pad.

The slurries within the containers 111 and 112 flow through the feed lines 113 and 114, respectively, to a manifold 121. Pumps 115 and 116 regulate the flow through the feed lines 113 and 114, respectively. Manifold 121 regulates flow of the slurries to the polishing pad. Valves (not shown) are opened and closed by the polisher, depending upon which of the two slurries is to be delivered to the polishing pad.

After passing through the manifold, the desired polishing slurry flows through a piece of dispense tubing 122 and is delivered to polishing section 13. The polishing section 13 includes a tub 131, a platen 132 and a polishing pad. For simplicity, the combination of the platen and polishing pad is just denoted as the platen 132. Above the platen 132 is a substrate holder 133 and a semiconductor device substrate 134. During polishing, the polishing slurry is dispensed from tubing 122 onto the platen 132, and excess slurry is eventually received by the tub 131, at which time the polishing slurry may be recycled or discarded. Substrate 134 is held against the pad while the slurry is dispensed and while the platen is rotating to polish exposed layers of the substrate.

FIGS. 2–5 illustrate, in cross-sectional views, an example of how a semiconductor device substrate 250 is processed using, for example, the polisher of FIG. 1 in practicing the present invention. Semiconductor device substrate 250 of FIG. 2 includes a metal interconnect 252 having an overlying anti-reflective coating (ARC) 254. Metal interconnect 252 can be formed of aluminum, an aluminum alloyed with copper or silicon, copper, a copper alloy, or the like. ARC 254 is typically a metal nitride such as titanium nitride, tantalum nitride, aluminum nitride, or the like. An interlevel dielectric (ILD) layer 255 is deposited over metal interconnect 252 and ARC 254 and is etched to form a via opening (also known as a contact opening) which exposes a top portion of the metal interconnect 252. ILD layer 255 is usually an oxide material that is chemically vapor deposited and can be doped or undoped. The via opening is etched using conventional anisotropic dry oxide etching techniques. As thus far described, semiconductor device substrate 250 can be formed using conventional semiconductor fabrication techniques.

Figure 2:
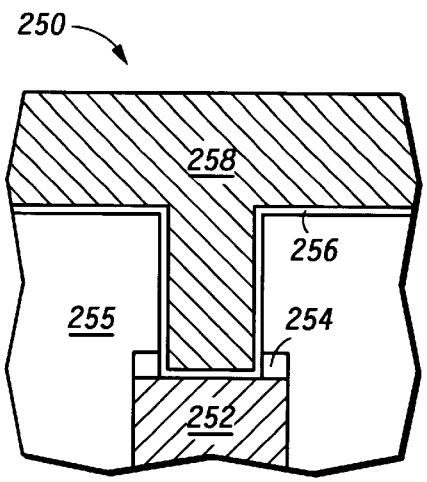
FIGS. 2–5 illustrate, in cross-sectional views, a portion of a semicond tor device substrate as it is polished in accordance with one embodient of the present invention.

After forming a via opening, a plug layer is formed by sequentially depositing a titanium layer 256 over the upper surface of the ILD layer and within the via opening as shown in FIG. 2. After depositing titanium layer 256, the plug filling material is deposited. In one embodiment, this material is a tungsten layer 258 as shown in FIG. 2. In addition to titanium layer 256, a titanium nitride layer (not shown) can be used between the titanium layer 256 and tungsten layer 258. Titanium and/or titanium nitride layers function as adhesion and barrier layers in the interconnect metallization. The titanium layer is typically much thinner than the plug fill material. For example, titanium layer 256 is less than 1,oooA thick while the tungsten layer is at least half the via opening width, and is usually between 2,000–10,000 Å

Figure 3:
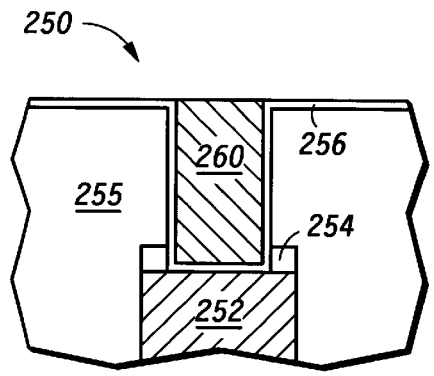

Both the tungsten layer 258 and the titanium layer 256 outside the opening need to be removed to produce a plug within the via opening. This is achieved by polishing in accordance with the present invention. The tungsten layer is first removed using the polisher 10 previously described. Preferably, the polishing pad used is a relative soft one (wherein its Shore D hardness is less than 45, such as with the Politex polishing pad mentioned previously), but harder pad materials (having harnesses in excess of Shore D 45, such as Suba 500 pads) are also suitable. A first polishing slurry is pumped from container 111, through feed line 113, manifold 121, and is dispensed onto platen 132 through dispense tubing 122. In the case of polishing a tungsten layer, a preferred slurry is an acidic ferric nitrate ($Fe(NO_3)_3$ chemistry in combination with water and alumina abrasive particles. Polishing is performed until tungsten layer 258 is removed from everywhere beyond via opening, as shown in FIG. 3, to produce a tungsten plug 260 within the via opening. Timed polishing or any type of end-point detection for polishing can be used to determine when the tungsten is adequately removed. Dispense rates, rotational speeds and polishing times and pressures to remove the tungsten are optimized within conventional ranges. As one example, a 6,000 Å tungsten layer is polished for about two minutes using a pressure of 5 pounds per square inch (PSI) and a rotational speed of 30 revolutions per minute (RPM), and a slurry of 10% by weight ferric nitrate solution in a 1:1 ratio with 6% by weight aluminum abrasive in deionized water. Such a slurry will have a pH less than 2, and generally within the range of 1.2–1.5. Under such conditions, tungsten is polished at a rate of about 6,000 Å per minute, while titanium is polished at a rate of only 300–400 Å per minute.

After removing tungsten layer 258 from beyond the via opening as shown in FIG. 3, the slurry chemistry is switched to deliver the polishing slurry of container 112 to the polishing platen for removing titanium layer 256. Switching slurries is achieved by closing the valve of the manifold associated with the first slurry and opening the valve associated with the second slurry. The second slurry is then delivered from container 112, through feed line 114, manifold 121, and is dispensed onto platen 132 through dispense tubing 122. During the switch from the first slurry to the second slurry, the platen continues to be rotated, and the substrate continues to be held against the polishing pad with some pressure. As the slurry chemistry change is made, the titanium layer is polished at a much faster rate than any titanium exposed during polishing of the substrate with the first polishing slurry.

Figure 4:
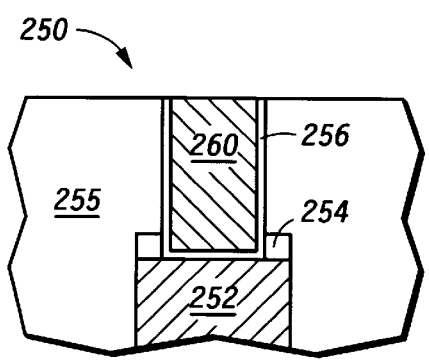

In a preferred embodiment where titanium is being polished, the second polishing slurry is an oxalic acid slurry having oxalic acid [$(COOH)_2$ or $HO_2CCO_2H$] in combination with water and alumina abrasive particles. Polishing is performed until titanium layer 256 is removed from everywhere beyond via opening, as shown in FIG. 4. Again, timed polishing or any type of end-point detection for polishing can be used to determine when the titanium is adequately removed. Dispense rates, rotational speeds and polishing times and pressures to remove the tungsten are optimized within conventional ranges. As one example, a 400 Å titanium layer is polished for about 30 seconds using a pressure of 5 PSI and a rotational speed of 30 RPM, and a slurry of 0.5% by weight oxalic acid solution in a 1:1 ratio with 6% by weight aluminum abrasive in deionized water. Such a slurry will have a pH less than 2, and generally within the range of 1.2–1.5. Since the oxalic acid slurry is not highly selective to ILD layer 255, it is preferred that a soft pad (as explained above) be used for polishing titanium layer 256 to avoid excess, and possibly non-uniform, oxide removal. Under such conditions, tungsten is polished at a rate of less than 200 Å per minute, while titanium is polished at a rate of about 1,500 Å per minute.

After removing the dissimilar conductive layers, substrate 250 is preferably moved to a finishing platen of the polisher (not shown) to remove residual particles from the surface of the substrate 250. In one embodiment, a short dielectric polish using a basic slurry may be performed on the finishing platen to provide a smooth surface to the ILD layer 255. A water rinse follows to remove any remaining basic slurry. In another embodiment, only water (without the basic slurry) is introduced over the finishing platen. The finishing platen typically has a soft pad, which may be identical to the polishing pad (see, e.g. the commonly assigned co-pending application by Kim et al. entitled "Process for Polishing a Semiconductor Device Substrate, Serial No. 08/780,113, filed Dec. 26, 1996). Since most commercially available polishers have just two platens (typically one for polishing and one for buffing or finishing), and since a finishing or buffing polish of the ILD layer 255 is preferred after removing a metal layer, it is preferred that the polishing of the dissimilar conductive materials in accordance with the invention occur on the same platen to best utilize floor space and capital expenditures. As such, the second platen of the polisher can be used for finishing. Alternatively, a finishing step could be performed on a separate machine, and each of the two platens of polisher 10 could be used to remove a different one of the conductive layers, or the finishing step could be eliminated altogether.

Figure 5:
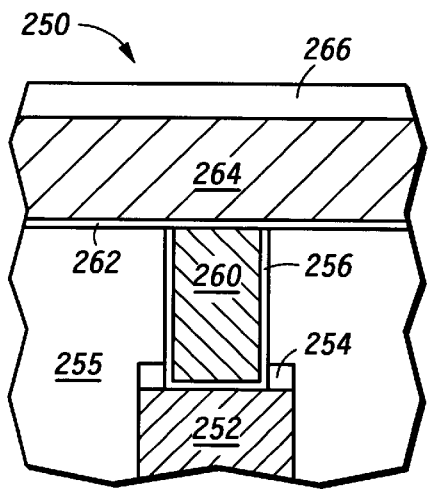

After plug formation is completed by removing tungsten layer 258 and titanium layer 256, the substantially completed semiconductor device substrate 250 is formed as shown in FIG. 5. Another titanium layer 262, or combination of titanium and titanium nitride is deposited, followed by a second level of metallization 264. Metallization 264 is similar to metal interconnect 252, for instance made of aluminum, an aluminum alloy, copper, a copper alloy, or the like. If the second level of metallization is the uppermost level of metallization for interconnects within a semiconductor device, a passivation layer 266 is deposited to complete the device. The passivation layer 266 is likely to be a doped oxide, nitride, silicon oxy-nitride, polyimide, or similar known passivation material.

Figure 6:
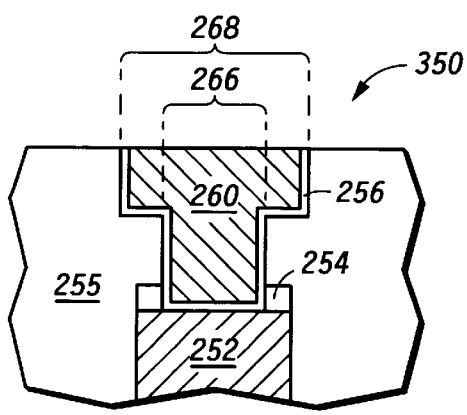
FIG. 6 illustrates, in a cross-sectional view, a portion of a semiconductor device substrate as made in accordance with an alternate embodiment of the present invention.

While the present invention has been described in reference to a specific embodiment wherein tungsten and titanium are polished, it is important to note the present invention is useful for polishing any two dissimilar overlying conductive materials. For example, the invention can be used in conjunction with polishing a metallization layer 264 of aluminum and an underlying titanium layer 256 in an inlaid interconnect application, as shown in a semiconductor device substrate 350 in FIG. 6. In inlaid applications, a plug to connect to the underlying metal interconnect 252 is not formed of a material different than the interconnect metallization. Instead, the next interconnect metallization, e.g. aluminum or copper, fills both a via opening 266 and an interconnect trench or channel 268 formed within the ILD 255. A single polishing operation is used to remove the aluminum and titanium from above the ILD, leaving the same metal in the via openings and the interconnect trenches as shown. Furthermore, the underlying metal layer need not be titanium to benefit from using an oxalic acid slurry composition. Other refractory-metal containing materials can be used as one of the dissimilar materials.

The foregoing description and illustrations contained herein demonstrate many of the advantages associated with the present invention. In particular, it has been revealed that two dissimilar conductive materials can be polished, each using stable slurry compositions designed to optimize the polishing rates and conditions for each material. Moreover, the polishing process is easily integrated into existing polishing processes. Polishers today are already equipped for receiving more than one component through its distribution systems, and most have more than one polishing platen (although such is not a requirement for practicing the invention). Yet another advantage of the present invention is that the use of oxalic acid for polishing offsets some of the adverse affects of using slurries containing heavy metals (which include alkali metals, alkaline earth metals and transition elements). For instance, use of ferric nitrate to polish tungsten results in iron contamination of the ILD oxide layers. Using an oxalic acid following the use of a ferric nitrate slurry is advantageous in that the oxalic acid ties up the iron which may be left within the polishing pad or on the substrate, thereby preventing the iron from contaminating an oxide ILD. In practicing the invention, it was found that the iron concentration within the ILD was less than 1E12 atoms/$cm^2$ within the top 200 Å of the exposed ILD surface, as compared to 1E14 atoms/$cm^2$ if using ferric nitrate slurry alone.

Thus it is apparent that there has been provided, in accordance with the invention, a process for polishing dissimilar conductive materials in a semiconductor device substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A process for forming a semiconductor device comprising:
   providing a substrate having:
      a semiconductor material;
      a patterned insulating layer overlying the semiconductor material, wherein the patterned insulating layer includes an opening;
      a first conductive layer including a first material lying over the patterned insulating layer and within the opening;

a second conductive layer including a second material that is different from the first material overlying the first conductive layer;

polishing the second conductive layer with a first polishing fluid including a first oxidizing component to expose a portion of the first conductive layer; and polishing the first conductive layer with a second polishing fluid including a second oxidizing component that is different from the first oxidizing component to expose a portion of the patterned insulating layer.

2. The process of claim 1, wherein the second material is selected from a group consisting of aluminum, copper, and tungsten, and the first material is a refractory metal-containing material.

3. The process of claim 1, wherein the first material is titanium, and wherein the second oxidizing component is oxalic acid.

4. The process of claim 1, wherein:

the second material is tungsten and the first material is titanium;

the first oxidizing component is ferric nitrate; and the second oxidizing component is oxalic acid.

5. The process of claim 1, wherein the patterned insulating layer overlies a conductive region of the substrate and is patterned to include an opening having an interconnect trench portion and a contact portion, wherein the contact portion extends to the conductive region and the interconnect trench portion overlies the contact portion without extending to the conductive region, and further comprising:

depositing the first conductive layer within the contact portion and interconnect trench portion of the opening; and depositing the second conductive layer over the first conductive layer and within the contact portion and the interconnect trench portion of the opening.

6. The process of claim 1, wherein polishing the second conductive layer comprises introducing the first polishing fluid without introducing the second polishing fluid.

7. The process of claim 1, further comprising placing the substrate into a polisher, wherein polishing the second conductive layer and polishing the first conductive layer are performed in the polisher.

8. The process of claim 7, wherein polishing the second conductive layer and polishing the first conductive layer are performed on a same platen within the polisher.

9. The process of claim 7, wherein polishing the second conductive layer is performed on a first platen within the polisher, and polishing the first conductive layer is performed on a second platen within the polisher.

10. The process of claim 1, wherein the second material is tungsten and wherein polishing the second conductive layer uses a polishing pad having a Shore D hardness of less than 45.

11. The process of claim 1, wherein the first polishing fluid contains a heavy metal, and wherein after polishing the first conductive layer, the patterned insulating layer includes the heavy metal at a concentration of less than 1E12 atoms per cubic centimeter within 200 angstroms of an exposed surface of the patterned insulating layer.

12. The process of claim 11, wherein the heavy metal of the first polishing fluid is iron.

13. The process of claim 1, wherein each of the first and second polishing fluids is acidic.

14. A process of forming a semiconductor device comprising:

providing a semiconductor substrate having a conductive member;

depositing an insulating layer over the semiconductor substrate, including over the conductive member;

forming a via opening in the insulating layer which exposes the conductive member;

depositing a first conductive layer over the insulating layer, including into the via opening;

depositing a second conductive layer, different in composition from the first conductive layer, on the first conductive layer;

providing a polisher having a polishing pad;

polishging the second conductive layer using a first polishing flid dispensed onto the polishing pad at least until the first conductive layer is exposed; and polishing the first conductive layer using a second polishing fluid, wherein an oxidizing component of the second polishing fluid is different than an oxidizing component of the first polishing fluid.

15. The process of claim 14, wherein polishing the first conductive layer comprises using the second polishing fluid dispensed onto the polishing pad.

16. The process of claim 14, the first conductive layer comprises titanium, and wherein the oxidizing component of the second polishing fluid is oxalic acid.

17. The process of claim 14, wherein the oxidizing component of the second polishing fluid is oxalic acid, adn wherein after polishing the first conductive layer, the insulating layer has an iron concentration of less than 1E12 atoms per cubic centimeter within 200 angstroms of an exposed surface of the insulating layer.

18. The process of claim 14, further comprising forming an interconnect trench in the insulating layer which overlies and is connected to the via opening, and wherein depositing the first conductive layer comprises depositing the first conductive layer into the interconnect trench and wherein depositing the second conductive layer comprises depositing the second conductive layer into the interconnect trench.

19. The process of claim 14, wherein polishing the second conductive layer comprises using the first polishing fluid without the second polishing fluid.

20. The process of claim 1, wherein a pH of the first polishing fluid is at most two.

21. The process of claim 20, wherein a pH of the second polishing fluid is at most two.

22. The process of claim 1, wherein a pH of the second polishing fluid is at most two.

* * * * *

UNITED STATES PATENT AND TRADEMARK OFFICE
CERTIFICATE OF CORRECTION

PATENT NO. : 6,204,169 B1
DATED : March 20, 2001
INVENTOR(S) : Rajeev Bajaj et al.

Page 1 of 1

It is certified that error appears in the above-identified patent and that said Letters Patent is hereby corrected as shown below:

Claim 1, column 6,
Line 67, after "opening;" add -- and --

Claim 14, column 7,
Line 23, change "flid" to -- fluid --

Claim 17, column 7,
Line 36, change "and" to -- and --

Signed and Sealed this

Twenty-third Day of October, 2001

*Attest:*

NICHOLAS P. GODICI
*Attesting Officer*    *Acting Director of the United States Patent and Trademark Office*